United States Patent
Meyer-Berg

(10) Patent No.: US 7,317,251 B2
(45) Date of Patent: Jan. 8, 2008

(54) MULTICHIP MODULE INCLUDING A PLURALITY OF SEMICONDUCTOR CHIPS, AND PRINTED CIRCUIT BOARD INCLUDING A PLURALITY OF COMPONENTS

(75) Inventor: Georg Meyer-Berg, Müchen (DE)

(73) Assignee: Infineon Technologies, AG, Neubiberg (DE)

( * ) Notice: Subject to any disclaimer, the term of this patent is extended or adjusted under 35 U.S.C. 154(b) by 113 days.

(21) Appl. No.: 11/246,563

(22) Filed: Oct. 11, 2005

(65) Prior Publication Data

US 2006/0060954 A1 Mar. 23, 2006

Related U.S. Application Data

(63) Continuation of application No. PCT/DE2004/000750, filed on Apr. 8, 2004.

(30) Foreign Application Priority Data

Apr. 11, 2003 (DE) ................................ 103 17 018

(51) Int. Cl.
*H01L 23/34* (2006.01)
(52) U.S. Cl. ..................... 257/724; 257/723; 438/107
(58) Field of Classification Search ................ 257/723, 257/724, 686, 374, 506, 501, 725; 438/107, 438/108, 110
See application file for complete search history.

(56) References Cited

U.S. PATENT DOCUMENTS

| | | | | |
|---|---|---|---|---|
| 3,903,590 A | * | 9/1975 | Yokogawa | .................. 438/107 |
| 4,208,698 A | * | 6/1980 | Narasimhan | ................. 361/793 |
| 4,466,181 A | * | 8/1984 | Takishima | .................. 438/107 |
| 4,821,282 A | | 4/1989 | Podgorski | |
| 4,907,062 A | * | 3/1990 | Fukushima | .................. 257/684 |
| 5,422,513 A | * | 6/1995 | Marcinkiewicz et al. | ... 257/668 |

(Continued)

FOREIGN PATENT DOCUMENTS

GB 1513893 6/1974

(Continued)

OTHER PUBLICATIONS

Laskar, A.S. and S. Blythe, "Epoxy Multichip Modules: A Solution to the Problem of Packaging and Interconnection of Sensors and Signal-Processing Chips.", *Sensors and Actuators- A Physical*, A 36 Mar. 1-27, 1993, No. I, Lausanne, CH.

*Primary Examiner*—S. V. Clark
(74) *Attorney, Agent, or Firm*—Edell, Shapiro & Finnan, LLC

(57) ABSTRACT

A multichip module includes at least one first semiconductor chip and at least one second semiconductor chip. The semiconductor chips are arranged in coplanar fashion on or in a support medium and respectively include matching components and contact areas arranged on their active top sides. At least one second semiconductor chip includes an arrangement of contact areas which is mirror-inverted in relation to a first semiconductor chip. At least one first semiconductor chip and at least one second semiconductor chip are arranged next to and/or behind one another (i.e., adjacent to one another) such that those of their edges which respectively have a matching arrangement of contact areas are opposite one another. Wiring arrangements extend between respectively opposite contact areas and between contact areas at the outer edges of the semiconductor chips and external contacts.

24 Claims, 5 Drawing Sheets

U.S. PATENT DOCUMENTS

| | | | |
|---|---|---|---|
| 5,492,586 A | 2/1996 | Gorczyca | |
| 5,592,188 A | 1/1997 | Doherty et al. | |
| 5,625,235 A * | 4/1997 | Takiar | 257/776 |
| 5,723,906 A * | 3/1998 | Rush | 257/723 |
| 5,847,453 A * | 12/1998 | Uematsu et al. | 257/728 |
| 5,994,739 A | 11/1999 | Nakagawa et al. | |
| 6,159,767 A | 12/2000 | Eichelberger | |
| 6,208,546 B1 | 3/2001 | Ikeda | |
| 6,229,203 B1 * | 5/2001 | Wojnarowski | 257/668 |
| 6,590,337 B1 * | 7/2003 | Nishikawa et al. | 313/509 |
| 6,864,122 B1 * | 3/2005 | Huse et al. | 438/110 |
| 2001/0026434 A1 | 10/2001 | Loddenkoetter | |
| 2002/0005576 A1* | 1/2002 | Sakamoto et al. | 257/687 |
| 2002/0031856 A1 | 3/2002 | Lee et al. | |
| 2002/0044476 A1 | 4/2002 | Nuxoll et al. | |
| 2002/0094701 A1 | 7/2002 | Biegelsen et al. | |
| 2002/0108775 A1 | 8/2002 | Foster, Sr. | |
| 2004/0007775 A1* | 1/2004 | Park | 257/724 |
| 2006/0214288 A1* | 9/2006 | Ohsumi | 257/724 |
| 2006/0267193 A1* | 11/2006 | Akiyama et al. | 257/725 |

FOREIGN PATENT DOCUMENTS

| | | |
|---|---|---|
| GB | 2130794 A | 6/1984 |
| JP | 57084759 A2 | 5/1982 |
| JP | 02253679 A2 | 10/1990 |
| JP | 2001250914 A2 | 9/2001 |
| WO | WO 88/04847 | 7/1988 |
| WO | WO 97/33140 | 9/1997 |
| WO | WO 02/077700 A2 | 10/2002 |

* cited by examiner

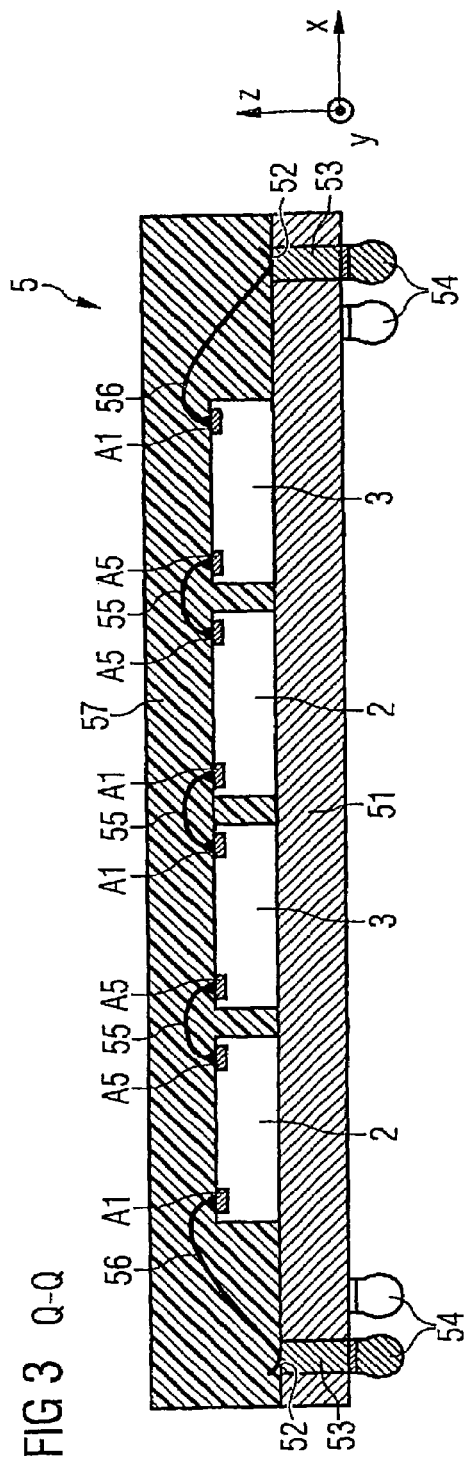
FIG 3 Q-Q
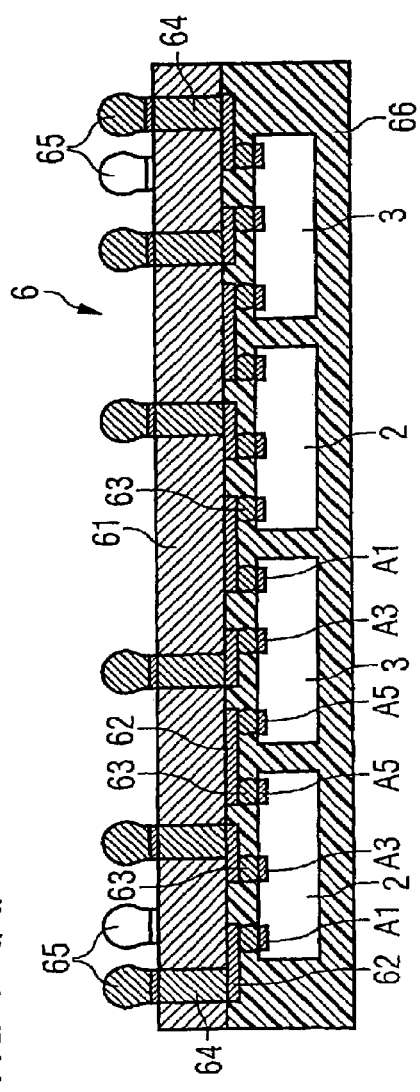
FIG 4 Q-Q

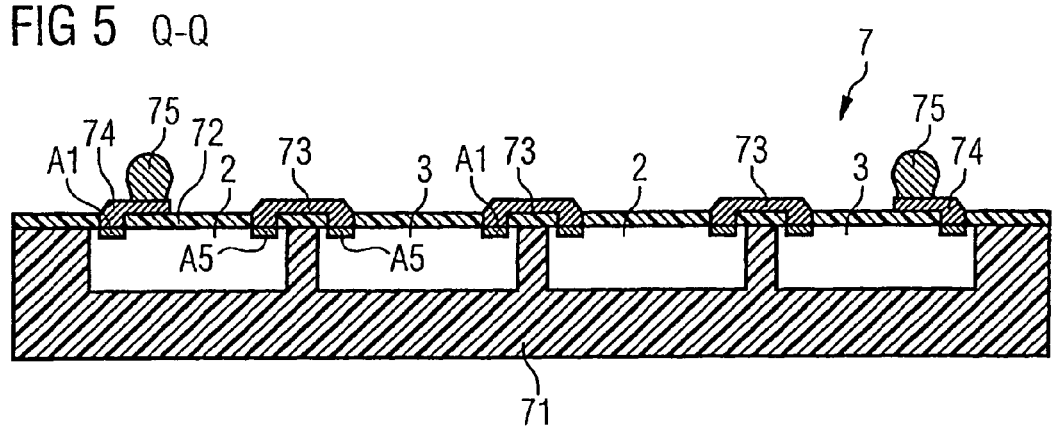
FIG 5 Q-Q
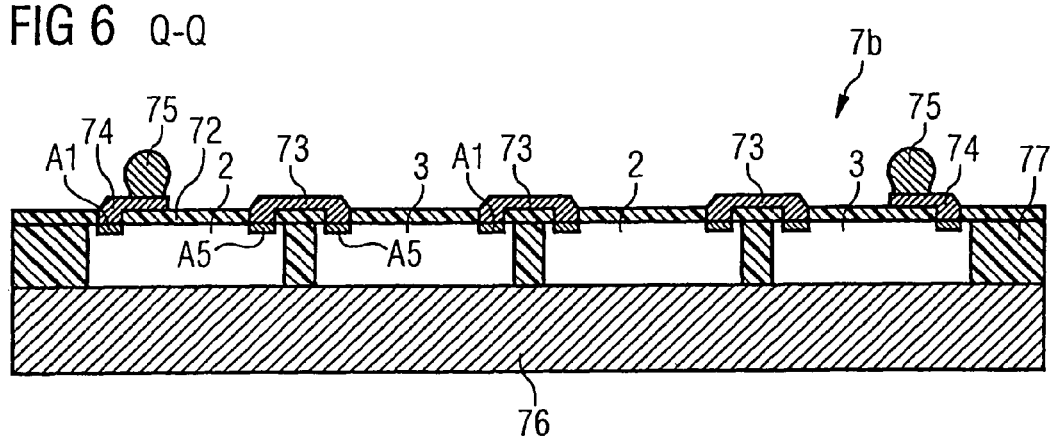
FIG 6 Q-Q

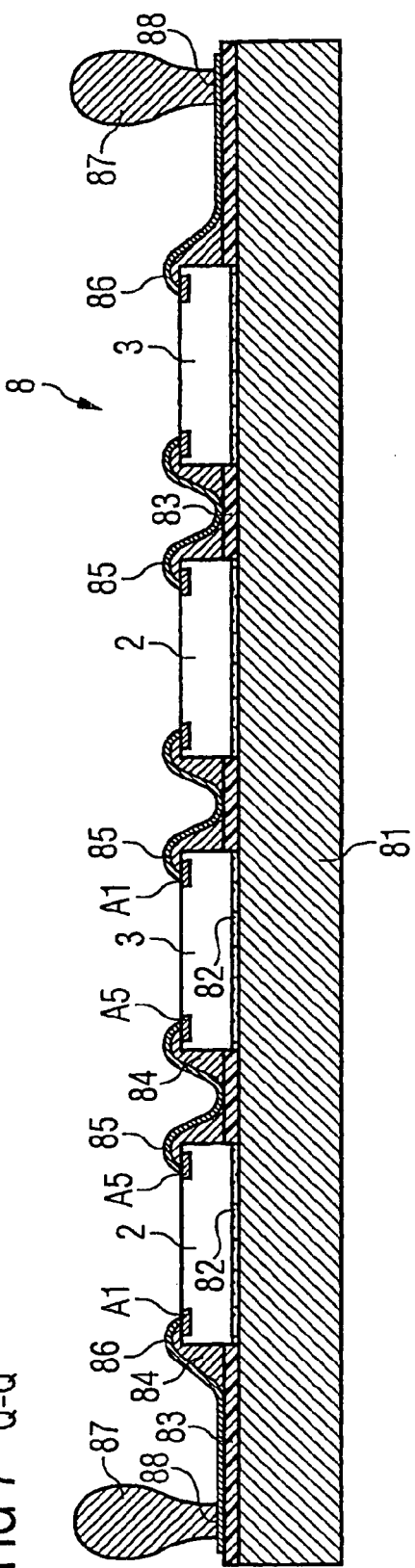
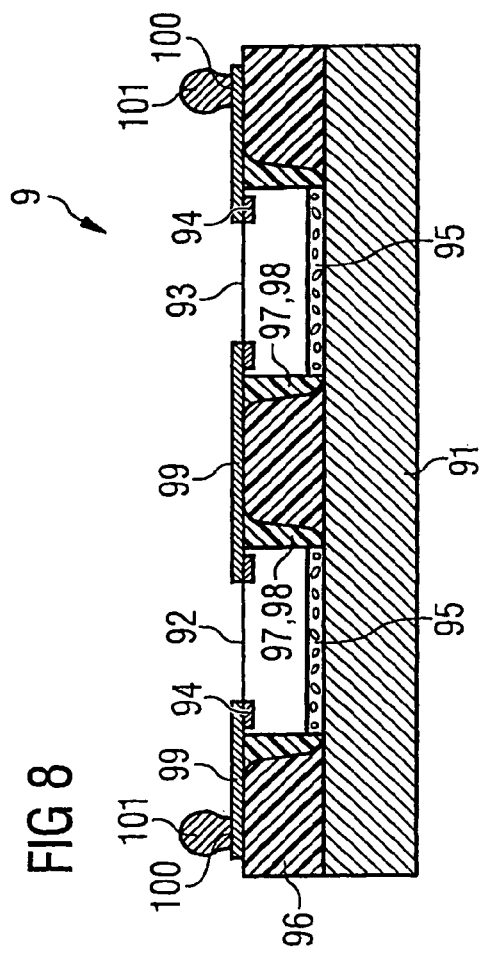

MULTICHIP MODULE INCLUDING A PLURALITY OF SEMICONDUCTOR CHIPS, AND PRINTED CIRCUIT BOARD INCLUDING A PLURALITY OF COMPONENTS

CROSS-REFERENCE TO RELATED APPLICATIONS

This application is a continuation of PCT/DE2004/000750, filed, Apr. 8, 2004, and titled "Multichip Module Comprising A Plurality Of Semiconductor Chips, And Printed Circuit Board Comprising A Plurality Of Components," which claims priority under 35 U.S.C. § 119 to German Application No. DE 103 17 018.9, filed on Apr. 11, 2003, and titled "Multichip Module Comprising A Plurality Of Semiconductor Chips, And Printed Circuit Board Comprising A Plurality Of Components," the entire contents of each are hereby incorporated by reference.

FIELD OF THE INVENTION

The invention relates to a multichip module including a plurality of semiconductor chips and also to a printed circuit board including a plurality of components.

BACKGROUND

Electronic devices are known which have a plurality of semiconductor chips arranged next to one another on a mounting substrate. In this arrangement, these semiconductor chips have contact areas which are the starting point for wiring arrangements both for connecting the semiconductor chips to one another and for connection to external contacts on the mounting substrate. The wiring arrangement connecting the semiconductor chips to one another is often very complex and very cost intensive.

SUMMARY OF THE INVENTION

It is an object of the invention to provide a multichip module that includes a plurality of semiconductor chips and a simple wiring arrangement.

It is another object of the invention to provide a printed circuit board that includes a plurality of components and a simple wiring arrangement.

The above and further objects are achieved individually and/or in combination, and it is not intended that the present invention be construed as requiring two or more of the objects to be combined unless expressly required by the claims attached hereto.

In accordance with the present invention, a multichip module comprises at least two semiconductor chips arranged in one plane on or in a support medium. The semiconductor chips each include at least one integrated circuit, and at least one second semiconductor chip is designed relative to a first semiconductor chip such that the contact areas arranged on an active top side of the second semiconductor chip are at least partly mirror-image symmetrical with respect to the contact areas on the first semiconductor chip. In this context, mirror-image symmetry is understood to mean mirroring at a mirror plane that is arranged perpendicular to the active top side of the semiconductor chip.

The term second semiconductor chips, as used herein, refers to those semiconductor chips whose contact areas are each designed to be mirror-image symmetrical with respect to the contact areas on a first semiconductor chip. The term first semiconductor chips, as used herein, refer to un-mirrored semiconductor chips.

At least one first and at least one second semiconductor chip are arranged in the multichip module next to and/or behind one another (i.e., adjacent to one another) such that their edges, each including at least a partly matching arrangement of contact areas, are opposite one another. Respective contact areas that are directly opposite one another are connected to one another by first wiring arrangements. Second wiring arrangements run from the outer edges of the semiconductor chips, which are directly followed by no further semiconductor chips, to external contacts on the multichip module, which are arranged particularly on a top side of the support medium.

In accordance with an embodiment of the invention, electronic devices comprising a plurality of semiconductor chips, particularly to the same specification, include first semiconductor chips and second semiconductor chips, the second semiconductor chips having a mirror-image symmetrical arrangement of contact areas in relation to the contact areas of the first semiconductor chip, arranged alternately next to and/or behind one another. In this embodiment, the semiconductor chip edges that are opposite one another always have matching arrangements of contact areas. This results in significantly reduced wiring complexity in comparison with multichip modules which use just one variant of semiconductor chips.

In particular, the invention is based upon the insight that opposite edges of semiconductor chips can have a respectively identical arrangement of contact areas only if the contact areas of the first one of the semiconductor chips which are opposite one another are arranged in mirror-inverted fashion with respect to the contact areas of the second semiconductor chip.

Such a multichip module based on the invention results in a short and effective wiring arrangement among the individual semiconductor chips, with it being possible to avoid long line runs which cross one another and reduce or eliminate the need to provide vias. This is advantageous particularly in the case of wide buses. A bus, as used herein, refers to a multiplicity of lines.

Multichip modules based on the invention can be produced using any conceivable chip-to-chip connection types. The inventive arrangement of semiconductor chips can also be implemented advantageously using conventional printed circuit boards and packaged components or chips arranged thereon.

In accordance with a first embodiment of the invention, the number of first and second semiconductor chips is the same. The first and second semiconductor chips are arranged alternately next to one another and/or behind one another in one plane on or in the support medium and can form an essentially checkerboard-like pattern. In this embodiment, this essentially checkerboard-like pattern can be in rectangular or square form or, alternatively, can have an irregular profile of outer edges. It is sufficient, in this embodiment, for precisely one version of first semiconductor chips and precisely one further version of second semiconductor chips to be used. A checkerboard-like pattern of first and second semiconductor chips may easily be achieved if appropriate by rotating the semiconductor chips.

When designing the first and second semiconductor chips, or when planning a multichip module based on the invention, it is necessary to remember which edges of the first and second semiconductor chips form the outer edge of the checkerboard-like pattern. These outer edges are the location which is preferable to arrange the contact areas for the external communication, while the remaining edges of the semiconductor chips are best provided with contact areas for the internal communication. In an embodiment using ball grid arrays or BGAs, this difficulty does not arise, because in this embodiment the external contacts can be inside and the internal contacts can be outside.

In an embodiment of the invention, not only the contact areas of the second semiconductor chips but also all devices, particularly active devices, and also all internal line runs in the second semiconductor chips are designed to be at least partly or even fully mirror-inverted with respect to the first semiconductor chips. The result is a particularly simple and inexpensive fabrication of the semiconductor chips, because the intermediate masks or reticules used for fabricating the semiconductor chips can be used for both versions of the semiconductor chips or easily adapted such that they can be used to produce both second and first semiconductor chips in respectively matching number. In this embodiment, first and second semiconductor chips can be produced inexpensively using a single mask set.

The supply lines and/or the grounding lines of the semiconductor chips can also be arranged in mirror invariant form. For such supply and/or grounding lines, it is possible to provide wirebonds, known as downbonds, onto the mounting substrate, for example in the interspaces between the individual semiconductor chips of the multichip module.

When the contact areas of the semiconductor chips are used, and when care is taken to ensure that the arrangement of the supply lines is mirror invariant, it is also possible to transfer the test technology from the first semiconductor chip to the second semiconductor chip by redesignating the tester channels.

In one embodiment of the invention, the multichip module is produced using bonding technology. The support medium is in the form of a circuit substrate which has contact pads on its first top side which are connected, particularly via through contacts, to external contacts arranged on the second top side of the circuit substrate. The passive reverse sides of the semiconductor chips are put onto the first top side of the circuit substrate, particularly bonded using a conductive adhesive. The first wiring arrangements are in the form of first bonding connections. Portions of the second wiring arrangements are formed by second bonding connections, which connect the contact areas to the contact pads. The entire multichip module is encased in a plastic compound, particularly in an epoxy resin.

In a further embodiment of the invention, the multichip module is produced using flip chip technology. The multichip module comprises as support medium a primary board whose first top side facing the semiconductor chips holds metal wiring arrangements in at least one rewiring layer. These metal wiring arrangements are connected, particularly by through contacts, to external contacts arranged on the second top side of the primary board. The semiconductor chips are connected to these metal wiring arrangements by flip chip contacts. A plastic compound encapsulates the semiconductor chips and also the first top side of the primary board.

In another embodiment of the inventive multichip module, a direct rewiring layer is provided on the semiconductor chips, and the support medium is formed by a plastic compound which encloses the passive reverse sides and the lateral faces of the semiconductor chips. A patterned insulating layer comprising polyimide (PI) or benzocyclobutene (BCB), in particular, can extend over the active top sides of the semiconductor chips. This insulating layer leaves the contact areas of the semiconductor chips free, so that rewiring arrangements on one or more rewiring layers can make contact with the contact areas. The rewiring arrangements connect contact areas to adjacent contact areas and/or to external contacts. The external contacts are situated on the insulating layer, either above the active top sides of the semiconductor chips or above the regions of the plastic compound which are situated between or next to the semiconductor chips. The rewiring arrangements run at least partly via regions of the insulating layer.

In a further embodiment of the inventive multichip module, the passive reverse side of the semiconductor chips is preferably bonded using a conductive adhesive layer and is put onto a circuit carrier. The wiring arrangements are situated in at least one patterned rewiring layer which extends over the active top sides of the semiconductor chips and over the intermediate or adjacent regions of the top side of the circuit carrier. The level difference between the active top side of the semiconductor chips and the top side of the circuit carrier allow the rewiring layer to be in corrugated form. The patterned rewiring layer has external contact areas particularly in edge regions of the multichip module which hold the external contacts. To allow simple connection of the inventive multichip module to further devices, the top sides of the external contacts project upward over the level of the active top sides of the semiconductor chips and are situated at a common level.

In this embodiment of the invention, the support medium used may advantageously be a very stable circuit carrier made of plastic or made of metal, which improves the stability and useful life of the multichip modules. When a metal circuit carrier is provided, it is advantageous to arrange a patterned insulating layer below the rewiring layer and resting on the top side of the circuit carrier. This insulating layer extends at least over the regions of the top side of the circuit carrier which are not covered by the semiconductor chips. In production, it is not always possible for the regions of the patterned insulating layer to end flush with the lateral faces of the semiconductor chips. Rather, negligibly small interspaces may be produced there.

If there is a level difference between the active top sides of the semiconductor chips and the surface of the circuit carrier or the surface of the insulating layer, it is advantageous to provide transitional points made of rubber-elastic material, particularly made of an elastomer, adjacent to the semiconductor chips. In this case, these transitional points made of rubber-elastic material may be in the form of a second insulating layer. The rewiring arrangements of the rewiring layer rest on this rubber-elastic material and are routed from the active top side of the semiconductor chip to the top side of the circuit carrier or to the top side of the insulating layer, avoiding kinks. By providing such additional transitional points, a robust and reliable wiring arrangement is ensured.

If the layer thickness of the insulating layer (or, if two stacked insulating layers are provided, the layer thickness of the two insulating layers) is greater than or equal to the sum of the height of the semiconductor chips and the layer thickness of the adhesive layer, the wiring arrangements in the rewiring layer are essentially planar in form. This results in an even more reliable and more robust wiring arrangement which may be in the form of a thin film circuit, in particular, and multilayered.

The semiconductor chip arrangement described above and illustrated in FIGS. 1 and 2 (as described below) may also be produced mutatis mutandis on a plastic printed circuit board having a plurality of circuit components arranged thereon whose functions are largely identical. In this context, the circuit components may be of any type and, by way of example, may be in the form of semiconductor chips or ICs in one or more ball grid arrays or flat conductor frame based packages. The circuit components can be put onto the printed circuit boards using any conceivable methods, for example by bonding using insulating or conductive adhesive or by soldering. In this case, the circuit components are divided into first and second circuit components. The second circuit components have an at least partly or even fully mirror-inverted arrangement of contact areas or contact pads with respect to the first circuit components. The contact between the first and second circuit components and also between said components and the conductor tracks on the printed circuit board can be made by wires or by making direct contact between the contact areas of the semiconductor chips or the external contact areas of the circuit components and the rewiring layers. Largely crossing-free and reliable contact is obtained which can be produced with little wiring complexity and hence easily and inexpensively.

The invention also relates to an electronic device which has one or more semiconductor chips whose passive reverse side is put onto the top side of a circuit carrier made of metal or made of an alloy using an insulating or conductive adhesive layer. These semiconductor chips are thin-ground, which means that they have a relatively small height of less than 150 μm. Arranged next to and/or between the semiconductor chips there is a photopatterned insulating layer, particularly made of cardo, made of benzocyclobutene or made of polyimide, which extends over the top side of the circuit carrier and leaves free the regions of the semiconductor chips in each case and also the saw channels. As used herein, saw channels refer to those regions between the devices in which the electronic devices are later sawn apart. Arranged between the lateral faces of the semiconductor chips and the photopatterned insulating layer there are trenches whose dimensions are relatively small on account of production and which have a width of less than 100 μm, for example, and are filled with an insulating material at the top.

In accordance with the invention, the layer thickness of the photopatterned insulating layer corresponds roughly to the sum of the height of the thin-ground semiconductor chips and the layer thickness of the adhesive layer arranged below the semiconductor chips. Line paths in at least one rewiring layer run on the photopatterned insulating layer and/or on the insulating material of the trenches and/or on the passivation layer of the active top side of the semiconductor chips and/or on the saw channel. These line paths connect the contact areas of the semiconductor chips and/or the external contact areas and/or the support and hence possibly the chip reverse sides to one another. In this arrangement, the external contact areas are preferably put on the photopatterned insulating layer and bear external contacts, which may be rigid or flexible in form.

The inventive design of the electronic device ensures that the line paths in the rewiring layer or in the rewiring layers respectively run in one plane and are respectively very stable in form.

The circuit carrier may advantageously be chosen such that its coefficient of expansion corresponds roughly to the coefficient of expansion of the printed circuit board on which the electronic device is later mounted. Such coefficients of thermal expansion are preferably 11.3 to 16.6 ppm/° K. In this case, suitable circuit carrier materials are, in particular, iron/chromium/nickel alloys, whose coefficients of thermal expansion between 11.3-16.6 ppm/° K can be matched to the coefficient of expansion of a higher printed circuit board using different proportions of iron, chromium and nickel. Breaks, cracks and other damage which may arise during temperature fluctuations or heating on account of different coefficients of thermal expansion are reliably prevented thereby.

In accordance with one embodiment of the invention, the insulating material of the trenches has the material of the insulating adhesive layer which is arranged below the semiconductor chip or below the semiconductor chips. Such an electronic device can be fabricated very inexpensively, especially since the trenches can be filled with insulating adhesive at the same time as the semiconductor chips are inserted into the free regions of the photopatterned insulating layer.

In accordance with a further embodiment of the invention, the insulating material of the trenches comprises benzocyclobutene, polyimide or cardo, such that the semiconductor chip can also be bonded in electrically conductive form and the chip reverse side is thus grounded. If the insulating material of the trenches differs from the material of the photopatterned insulating layer, the trenches and their adjacent regions of the photopatterned insulating layer can be distinguished particularly clearly in the electronic device. Even if the insulating material of the trenches and of the photopatterned insulating layer is the same, it is possible to establish a boundary layer between the edge regions of the photopatterned insulating layer and the trenches.

With an electronic device of this type, the height of the insulating material in the trenches can be matched very accurately to the layer thickness of the photopatterned insulating layer and/or to the height of the semiconductor chip and also to the layer thickness of the adhesive layer arranged below the semiconductor chips. Typically, this matching is performed as part of the spin coating method.

The invention also relates to a method for fabricating electronic devices. In this case, a disk-like or rectangular circuit carrier, particularly made of metal, e.g. made of an alloy as already described above, is first fabricated.

Semiconductor chips are then provided and are thin-ground to a height of less than 150 μm. This is achieved by a technique of "dicing before grinding", for example. The top side of these semiconductor chips is preferably provided with a photoimide passivation layer.

An insulating layer is then applied to one surface of the circuit carrier. This application can be performed using a spin coating method, in which uniform and continuous coating of the surface of the circuit carrier can be achieved with a smooth and even nature of the surface. Using a suitable photoimide, it is possible to achieve relatively large layer thicknesses for the insulating layer in the region of up to 150 μm. In this case, cardo can be used to achieve layer thicknesses of up to 150 μm, polyimide can be used to achieve layer thicknesses of up to 30 μm and benzocyclobutene can be used to achieve layer thicknesses of up to 50 μm. In accordance with the invention, the layer thickness of the insulating layer to be applied is set such that it corresponds roughly to the sum of the height of the thin-ground semiconductor chip(s) and the layer thickness of the adhesive layer which is to be put onto the circuit carrier in order to mount the semiconductor chips. For example, such adhesive layers can include a layer thickness of 20 μm.

The insulating layer is then photopatterned such that depressions are produced in the insulating layer or free regions are produced on the circuit carrier for the semiconductor chips which are to be put on and for the saw channels. In practice, the free regions are frequently of only slightly larger design than the base area of the semiconductor chips.

The adhesive layer is then used to put or insert the reverse side of the thin-ground semiconductor chips onto the top side of the circuit carrier in coplanar fashion, specifically into the insulating layer's free regions produced by the photopatterning. In this case, an insulating adhesive is recommended for the adhesive layer if said adhesive is intended to fill the trenches completely.

The resultant trenches (which have relatively small dimensions on account of production) between the lateral faces of the semiconductor chips and the photopatterned insulating layer are then (or even when the semiconductor chips are put on) filled with an insulating material, which means that an essentially continuous, planar surface of the electronic device is produced. In the subsequent method step, arbitrary line paths in at least one rewiring layer are put onto this surface and can connect the contact areas of the semiconductor chips to one another, to external contact areas and to the support. In principle, any number of rewiring layers can be put on in this method step.

Finally, external contacts are put onto the external contact areas. The inventive device is suitable for putting on all conceivable solid, rigid or flexible, elastic external contacts, as described in DE 100 16 132 A1, for example. It is also possible to use any combinations or hybrid forms of such external contacts.

It is advantageous if the external contacts are not put on over the semiconductor chips, but rather, as a better measure, on the regions of the insulating layer which are situated between or next to the semiconductor chips. This is because the semiconductor chips have a different coefficient of expansion than the printed circuit board to which they are connected via the external contacts, which can result in damage to the external contacts or to the electrical device. If the external contacts are fitted over the semiconductor chips, it is necessary to ensure that the external contacts are not arranged too far away from the center of gravity of the semiconductor chip, in order to prevent damage.

Finally, the circuit carrier is sawed up into individual multichip modules in the saw channel by the respective outer edges of the multichip module positions.

This method can be used to process semiconductor chips very reliably, in a flat and space-saving form, to produce electronic devices. The inventive method also allows the use of particularly robust circuit carriers made of metal or made of alloys, which increases the stability of the electronic devices fabricated in accordance with the invention.

In accordance with an embodiment of this method, the top side of the semiconductor chips is situated at the same level as the top sides of the insulating layer, which ensures that the line paths in the rewiring layer or in the rewiring layers do not need to overcome a level difference. Rather, the line paths run essentially horizontally, which achieves a particularly reliable and stable wiring arrangement. This makes it possible to implement a multilayer feature very advantageously.

In line with a first particularly reliable variant of the method described, the trenches between the lateral faces of the semiconductor chips and the photopatterned insulating layer are filled by putting on and photopatterning a further insulating layer, which allows the use of conductive adhesives. In this case, the photopatterning ensures that the contact areas of the semiconductor chips remain freely accessible.

This further insulating layer likewise has a photoimide, particularly polyimide, benzocyclobutene or cardo and may likewise be applied to the electronic device using a spin coating method.

In accordance with a second embodiment of the method of the invention, the trenches between the lateral faces of the semiconductor chips and the photopatterned insulating layer are filled by the, in particular insulating, adhesive in capillary fashion. The quantity of adhesive which is used for putting each semiconductor chip onto the circuit carrier is proportioned such that the sum of the volume of the quantity of adhesive and the volume of the semiconductor chip corresponds roughly to the volume of a respective free region of the photopatterned insulating layer. In practice, a slight excess is used.

The adhesive fills the trenches and ensures that the top side of the electronic device is in essentially planar and continuous form. An additional method step for closing the trenches can thus be saved to the benefit of cost.

The methods described above for fabricating electronic devices may also be used to fabricate a multichip module having an arrangement of first and second semiconductor chips as described above. In this case, the first and second semiconductor chips are first thin-ground to a height of less than 150 µm and are then put into free regions of the photopatterned insulating layer such that those of their edges which respectively have an at least partly matching arrangement of contact areas are opposite one another. When the rewiring layer or the rewiring layers are put on, the line paths are designed such that respectively opposite contact areas are connected to one another and also the external contacts are connected to the contact areas of the semiconductor chip(s) and such that the support is thus grounded.

As a result, arbitrary rewiring layers can be put on and the rewiring complexity can be significantly reduced. It is often possible to connect the entire electronic device just using one wiring layer. In this case, it is possible to dispense with the provision of a second wiring layer so as to save cost.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIG. 3 is a view in cross-section of a wire-bonded first multichip module with the semiconductor chip arrangement shown in FIG. 1, with the cross-section taken along lines Q-Q.

FIG. 4 is a view in cross-section of a second multichip module, fabricated using flip chip technology, with the semiconductor chip arrangement as shown in FIG. 1, with the cross-section taken along lines Q-Q.

FIG. 5 is a view in cross-section of a third multichip module with the semiconductor chip arrangement shown in FIG. 1, with the cross-section taken along lines Q-Q.

FIG. 6 is a view in cross-section of a fourth multichip module with the semiconductor chip arrangement shown in FIG. 1, with the cross-section taken along lines Q-Q.

FIG. 7 is a view in cross-section of a fifth multichip module with the semiconductor chip arrangement shown in FIG. 1, with the cross-section taken along lines Q-Q.

FIG. 8 is a view in cross-section of an electronic device in accordance with the present invention.

DETAILED DESCRIPTION

Figure 1:
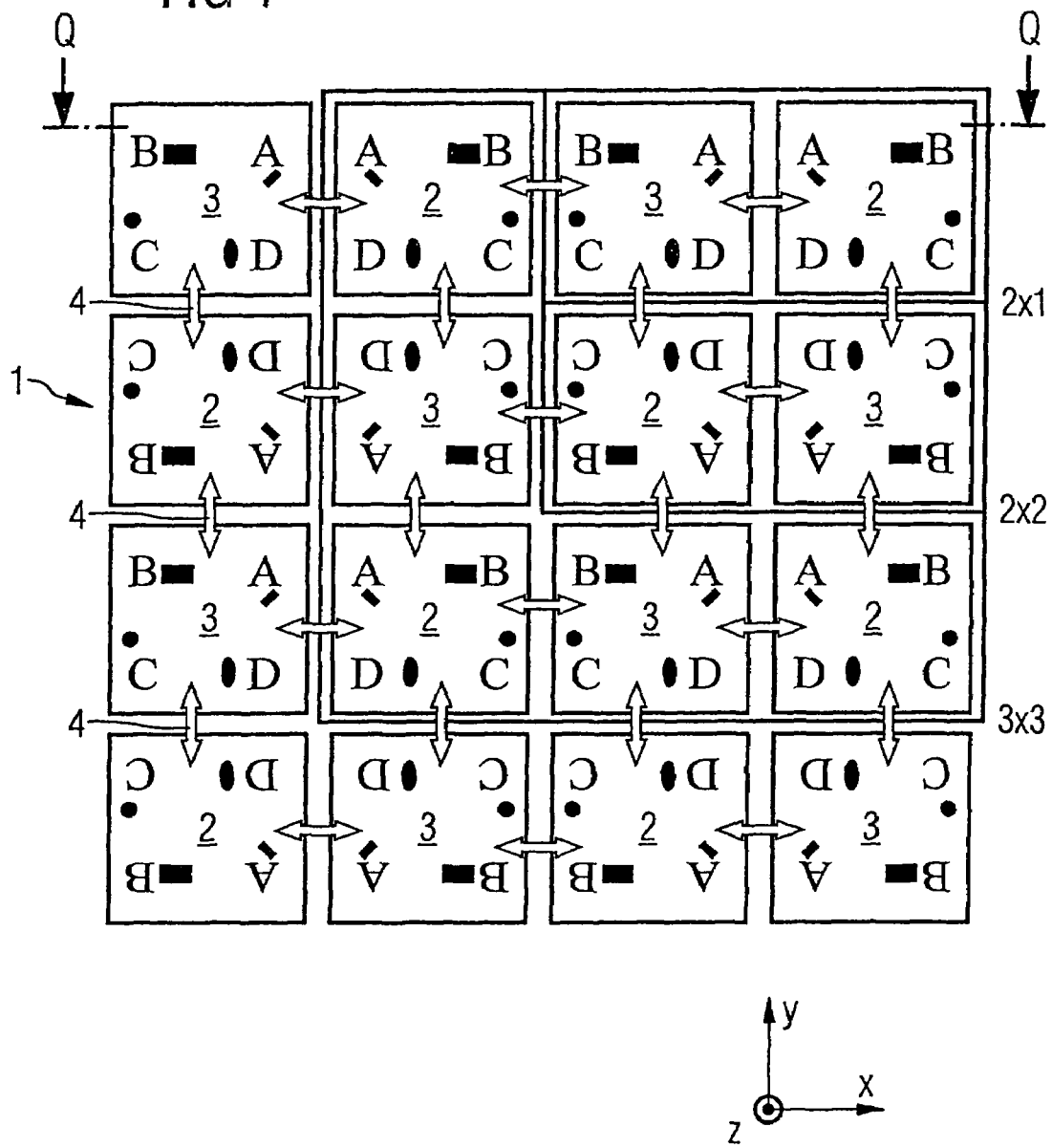
FIG. 1 is a plan view of a semiconductor chip arrangement depicting semiconductor chips arranged in rows and in columns in accordance with the present invention.

FIG. 1 shows a plan view of a semiconductor chip arrangement 1 with semiconductor chips arranged in rows and in columns, where the active top sides of the semiconductor chips are shown.

Figure 2:
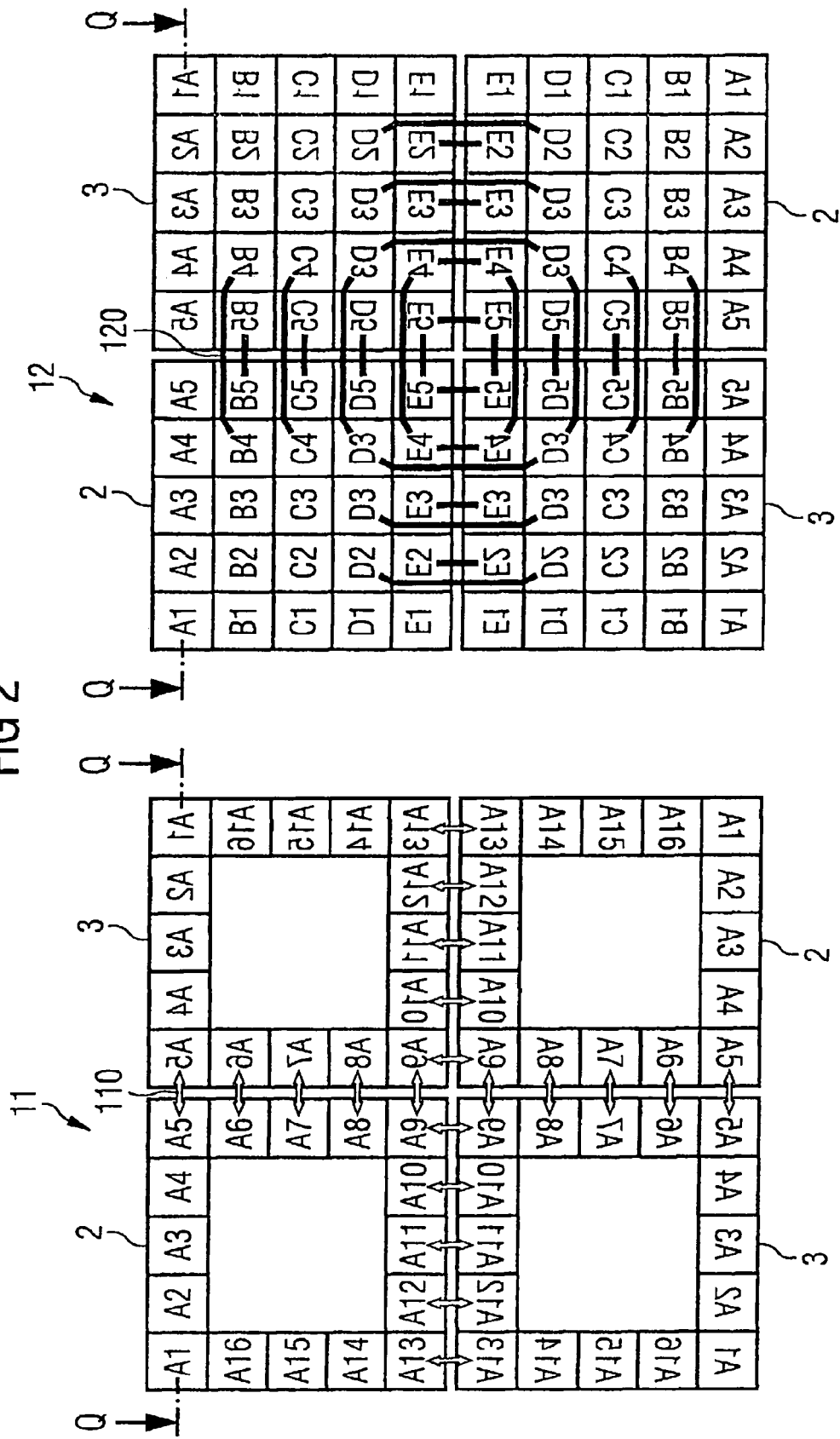
FIG. 2 is a schematic illustration of a plan view of a first semiconductor chip wiring arrangement and of a second semiconductor chip wiring arrangement in an enlarged 2×2 detail from the semiconductor chip arrangement shown in FIG. 1.

The following terms "next to one another", "behind one another", "above one another" and "on one another", as used in relation to FIGS. 1 and 2, are standardized according to an axis system with the coordinate axes x, y and z as shown next to the semiconductor chip arrangement 1 in FIG. 1. In this context, the term "next to one another" is used with reference to the x axis, the term "behind one another" is used with reference to the y axis and the term "above one another" and "on one another" are used with reference to the z axis.

The semiconductor chip arrangement 1 of FIG. 1 is designed as a square 4×4 matrix. However, and as also shown in FIG. 1, it is noted that semiconductor chip arrangements based on the invention may also be in the form of 2×1, 2×2 or 3×3 matrices or in the form of such arrangements of arbitrary size. Generally, the size of the inventive semiconductor chip arrangement can be described by $x_{ij}$, where i is defined as i=1, . . . , n and j as a function of i is defined as j(i)=1, . . . , $m_i$.

The semiconductor chip arrangement 1 comprises 16 semiconductor chips which are divided into eight first semiconductor chips 2 and into eight second semiconductor chips 3. The first semiconductor chips 2 and the second semiconductor chips 3 are arranged alternately next to and behind one another, resulting in a checkerboard-like pattern. First semiconductor chips 2 respectively form the left-hand front and the right-hand rear corners of the semiconductor chip arrangement 1. Second semiconductor chips 3 respectively form the left-hand rear and the right-hand front corners of the semiconductor chip arrangement 1.

The circular, oval, rectangular and rhombic symbols clarify the geometry and the mirroring of the first semiconductor chips 2 and of the second semiconductor chips 3. For this purpose, FIG. 1 also shows the semiconductor chip corners A, B, C and D of the semiconductor chips 2, 3.

Upon considering the order of the semiconductor chip corners A, B, C and D and the circular, oval, rectangular and rhombic symbols, it becomes clear that the first semiconductor chips 2 have a clockwise order A-B-C-D and the second semiconductor chips 3 have an anticlockwise arrangement D-C-B-A of the semiconductor chip corners. This means that respective identical edges of the first semiconductor chips 2 and of the second semiconductor chips 3, which edges have a mirror-image symmetrical arrangement of contact areas, are opposite one another.

The semiconductor chips 2, 3 arranged in rows 2 and 4 of the semiconductor chip arrangement 1 correspond entirely to the semiconductor chips 2, 3 arranged in rows 1 and 3, with the semiconductor chips 2, 3 arranged in rows 2 and 4 respectively being arranged so as to be rotated through 180° in the x-y plane.

The semiconductor chip arrangement 1 ensures that the respectively opposite edges of the first semiconductor chips 2 and of the second semiconductor chips 3 respectively match. These respectively matching edges of the semiconductor chips 2, 3 are connected by means of buses 4, which are shown by arrows in FIG. 1. The respectively matching arrangement of contact areas situated on opposite edges ensures that the wiring arrangements of the buses 4 can be of very short proportions and that crossings, vias and long runs of wiring arrangements are avoided.

Another striking feature of the semiconductor arrangement 1 is that its outer edges are respectively formed by the edges A-B and also B-C of the semiconductor chips 2, 3. The edges A-D and C-D form respective internal edges of the semiconductor chip arrangement 1. Accordingly, when designing the semiconductor chips 2, 3 it should be remembered that contact areas for external communication are best arranged at the edges A-B and B-C and that contact areas for internal communication in the semiconductor chips 2, 3 are predominantly situated at the edges A-D and C-D.

In semiconductor chip arrangements with other dimensions, the contact areas for external communication and for internal communication may also be situated at other edges, as revealed by a consideration of the 2×1 matrix shown in FIG. 1, for example, in which the edges A-B, B-C and C-D are situated on the outside and only the edges A-D are situated on the inside.

A sectional line Q-Q runs transversely through the first array of semiconductor chips 2, 3 in the semiconductor chip arrangement 1. The subsequent FIGS. 3-7 depict cross-sectional views in which the semiconductor chip arrangement 1 is shown along this sectional line Q-Q viewed from behind.

FIG. 2 shows a schematic illustration of a plan view of a first semiconductor chip wiring arrangement 11 and of a second semiconductor chip wiring arrangement 12 in an enlarged 2×2 detail from the semiconductor chip arrangement 1. This 2×2 detail is formed by the middle four semiconductor chips 2, 3 in the top two rows of the semiconductor chip arrangement 1.

The first semiconductor chip wiring arrangement 11 may be used for bonded semiconductor chips or for leadframe or flat conductor frame based devices, particularly for quad flat packages, for example.

The first semiconductor chip wiring arrangement 11 shows evenly arranged contact areas A1-A16 at the respective edges of the active top sides of the semiconductor chips 2, 3, with each edge having five contact areas A1-A5, A5-A9, A9-A13 and A13-A1 situated at it. The contact areas A1-A16 are arranged clockwise in the case of the first semiconductor chips 2 and, in the case of the second semiconductor chips 3, are arranged anticlockwise at the edges of the active top sides. The contact areas A5-A13 arranged at respectively opposite edges are respectively connected to one another by first wiring arrangements 110.

The second semiconductor chip wiring arrangement 12 is suitable, by way of example, for implementation using semiconductor chips in flip chip technology and using ball grid arrays. The second semiconductor chip wiring arrangement 12 is an implementation of the inventive wiring arrangement in flip chip technology. The implementation of the inventive wiring arrangement as a ball grid array differs only slightly from the second semiconductor chip wiring arrangement 12 described in FIG. 2.

The second semiconductor chip wiring arrangement 12 shows contact areas A1-A5, B1-B5, C1-C5, D1-D5 and E1-E5 which are distributed in FIG. 2 in a 5×5 matrix over the active top sides of the semiconductor chips 2, 3. In this case, the contact areas A1-A5, B1-B5, C1-C5, D1-D5 and E1-E5 of the second semiconductor chips 3 are arranged in mirror-image symmetrical form with respect to the contact areas A1-A5, B1-B5, C1-C5, D1-D5 and E1-E5 of the first semiconductor chips 2. In the case of the second semiconductor chip wiring arrangement 12, not only the directly opposite contact areas B5, C5, D5, E2, E3, E4 and E5 at the edges of the semiconductor chips 2, 3 but also the contact areas B4, C4, D2, D3 and D4 arranged in the rows or columns which are respectively next to or behind them are connected to one another by means of second wiring arrangements 120.

FIG. 3 shows a first multichip module 5, fabricated using bonding technology, with the semiconductor chip arrangement 1 in cross section Q-Q. The arrangement of the contact areas A1-A16 of the first multichip module 5 corresponds to the illustration of the first semiconductor chip wiring arrangement 11 in FIG. 2.

FIG. 3 likewise shows an axis system which is used to standardize the use of the terms "next to one another", "behind one another", "on one another" and "above one another". Specifically, the term "next to one another" is used with reference to the x axis, the term "behind one another" is used with reference to the y axis and the terms "on one another" and "above one another" are used with reference to the z axis. The logical use of these terms relates to the subsequent FIGS. 3-7.

The first multichip module 5 comprises a circuit substrate 51 which comprises laminate, particularly FR/BT IV, for example. The passive reverse sides of the semiconductor chips 2, 3 are put, particularly bonded, onto the top side of this circuit substrate 51. The illustration of the adhesive layer between the passive reverse sides of the semiconductor chips 2, 3, which are often connected to ground, and the illustration of the top side of the circuit substrate 51 have been omitted in FIG. 3.

The edges of the circuit substrate 51 have first through contacts 53 made of metal which extend from contact pads 52 on the top side of the circuit substrate 51 downward through the circuit substrate 51. At the underside of the circuit substrate 51, the first through contacts 53 are adjoined by humped first external contacts 54 which can be used to connect the first multichip module 5 to other electronic devices.

The illustration in FIG. 3 gives a particularly good view of the contact areas A1 and A5 on the active top sides of the semiconductor chips 2, 3. The wiring arrangement of the contact areas below one another and also of the contact areas with the contact pads 52 on the circuit substrate 51 are produced using bonding technology in the case of the first multichip module 5. In this context, very short first bonding connections 55 are provided which respectively connect the contact areas of adjacent first semiconductor chips 2 and second semiconductor chips 3 to one another. In this case, FIG. 3 shows the contact areas A1 and A5 by way of example. In addition, second bonding connections 56 are provided which connect contact areas situated at the outer edges of the semiconductor chip arrangement 1 to the contact pads 52 of the circuit substrate 51 and thus allow external contact to be made with all of the semiconductor chips 2, 3 in the first multichip module 5. FIG. 3 shows the second bonding connections 56 from the contact areas A1 to the contact pads 52.

The first multichip module 5 is provided with a first plastic encapsulation 57 such that the semiconductor chips 2, 3, the bonding connections 55, 56 and the contact pads 52 are totally encased by the plastic compound.

FIG. 4 shows a second multichip module 6, fabricated using flip chip technology, with the semiconductor chip arrangement 1 in cross section Q-Q. The arrangement of the contact areas A1-E5 in the second multichip module 6 corresponds to the illustration of the second semiconductor chip wiring arrangement 12 in FIG. 2.

The second multichip module 6 comprises a primary board 61 which comprises plastic. By the edges of the primary board 61 there are conductive, particularly metal, second through contacts 64 running through the primary board 61. These second through contacts 64 are adjoined at the top side of the primary board 61 by humped second external contacts 65.

On the underside of the primary board 61, metal wiring arrangements 62 arranged in a rewiring plane lie on the primary board 61. In this case, the metal wiring arrangements 62 are connected to the second through contacts 64 and serve to make contact between the semiconductor chips 2, 3 and between the semiconductor chips and the outside. The metal wiring arrangements 62 do not have to be in one rewiring plane as shown in FIG. 4. There may also be a plurality of rewiring planes arranged above one another.

The semiconductor chips 2, 3 are arranged below the primary board 61 and have their active top sides oriented toward the underside of the primary board 61. Flip chip contacts 63 are used to connect the contact areas A1-E5 to the metal wiring arrangements 62. The semiconductor chips 2 and 3, the metal wiring arrangements 62 and the flip chip contacts 63 are optionally totally encased by a second plastic encapsulation 66.

The metal wiring arrangements 62 are divided into metal wiring arrangements 62 which connect respectively opposite contact areas to one another and into metal wiring arrangements 62 which route the other contact areas situated on the semiconductor chip arrangement 1 to the second through contacts 64. FIG. 4 shows those metal wiring arrangements 62 which connect the opposite contact areas A1 and A5 to one another and which connect the contact areas A1 to the second through contacts 64. The metal wiring arrangements 62 are in very short form and are simple to implement, especially since the respective contact areas to be connected on the semiconductor chips 2, 3 are opposite one another.

The inventive use of photopatterned wiring provides the beneficial result that the second external contacts 65 may be arranged both at the edges and centrally, particularly above the central regions of the semiconductor chips 2, 3. This results in a particularly space-saving form of the second multichip module 6.

FIG. 5 shows a third multichip module 7 with the semiconductor chip arrangement 1 in cross section Q-Q. The arrangement of the contact areas A1-A16 of the third multichip module 7 corresponds to the illustration of the first semiconductor chip wiring arrangement 11 in FIG. 2. The third multichip module 7, which is also called a universal package, has electrical contact made with it by precisely one direct rewiring layer. For other multichip modules (not shown here), there may also be rewiring using a plurality of rewiring layers.

In FIG. 5, the semiconductor chips 2, 3 are shown with their active top sides oriented toward the top of the module. The passive reverse sides and also the lateral faces, but not the active top sides of the semiconductor chips 2, 3, are surrounded by a plastic compound, particularly by an epoxy resin, which forms a plastic support 71 for the semiconductor chips 2, 3. In this case, the plastic support 71 is in a form such that its top side is situated between and next to the semiconductor chips 2, 3 at the same level as the active top sides of the semiconductor chips 2, 3 or slightly higher than the active top sides of the semiconductor chips 2, 3.

The top side of the semiconductor chips 2, 3 includes a patterned polyimide layer 72 that leaves free only the contact areas A1-A16 on the active top sides of the semiconductor chips 2, 3. Working multichip modules may also be produced without a patterned polyimide layer 72 of this type. The polyimide layer 72 shown in FIG. 5 may also be photopatterned such that it extends only over the active top sides of the semiconductor chips 2, 3 and leaves free the regions of the plastic support 71 which are situated between or next to the semiconductor chips 2, 3.

In this embodiment, first rewiring arrangements 73 and second rewiring arrangements 74 in the rewiring layer are put onto the patterned polyimide layer 72. The first rewiring arrangements 73 connect the individual semiconductor chips 2, 3 to one another. The second rewiring arrangements 74 connect the contact areas situated at the edge of the semiconductor chip arrangement 1 to third external contacts 75, which project upward and are supported on the second rewiring arrangements 74. In this embodiment of the invention, the first and second rewiring arrangements 73, 74 run in essentially planar form and may be of multilayer design.

The inventive semiconductor chip arrangement 1 and the very short and easily produced first and second rewiring arrangements 73, 74 which are dependent thereon allow all of the rewiring arrangements 73, 74 in the third multichip module 7 to be produced in a single rewiring layer. This means that such multichip modules can be produced more quickly and with greater cost savings.

FIG. 6 shows a fourth multichip module 7b with the semiconductor chip arrangement 1 in cross section Q-Q. The arrangement of the contact areas A1-A6 in the fourth multichip module 7b corresponds to the illustration of the first semiconductor chip wiring arrangement 11 in FIG. 2.

In many respects, the fourth multichip module 7b corresponds to the third multichip module 7 from FIG. 5, with the semiconductor chips 2, 3 not being surrounded by a plastic support 71 but rather having their passive reverse sides put or bonded onto a thermally and mechanically stable and even support, in the exemplary embodiment onto a support plate 76 made of metal or made of silicon. The semiconductor chips 2, 3 preferably have a height of less than 150 μm.

The support plate 76 has a photoimide layer 77 disposed thereon which encloses the sides of the semiconductor chips 2, 3 and supports the patterned polyimide layer 72. This photoimide layer 77 has a photopatternable insulator, for example CARDU. Two insulating layers are thus arranged above one another, namely the patterned polyimide layer 72 and the photoimide layer 77. The height of these two layers 72, 77 should altogether be at least as much as the height of the semiconductor chips 2, 3 and the adhesive layer (not shown) arranged below them.

FIG. 7 shows a fifth multichip module 8 with the semiconductor chip arrangement 1 in cross section Q-Q. The arrangement of the contact areas A1-A16 in the fifth multichip module 8 corresponds to the illustration of the first semiconductor chip wiring arrangement 11 in FIG. 2.

The fifth multichip module 8 is constructed on a first circuit carrier 81 arranged right at the bottom, which comprises metal in particular. The passive reverse side of the semiconductor chips 2, 3 is mounted on the top side of the first circuit carrier 81. This mounting is implemented by a patterned first adhesive layer 82 in FIG. 5. Between the semiconductor chips 2, 3 and in the edge regions of the fourth multichip module 8, there is a first photopatterned insulating layer 83 on the top side of the first circuit carrier 81. In FIG. 5, this photopatterned first insulating layer 83 is shown such that it ends flush with the lateral faces of the semiconductor chips 2, 3. The first photopatterned insulating layer 83 shown in idealized form in FIG. 7 is preferably designed such that it does not run right up to the lateral faces of the semiconductor chips 2,3.

To ensure that a level transition from the active top side of the semiconductor chips 2, 3 to the first photopatterned insulating layer 83 is not abrupt but rather continuous, rubber-elastic transitional points 84 produced from an elastomer, in particular, are provided on the edge faces of the semiconductor chips 2, 3.

The regions of the first photopatterned insulating layer 83 that are not covered by the transitional points 84 and also the transitional points 84 themselves have third and fourth line paths 85, 86 made of metal running on them. In this case, the third line paths 85 connect opposite contact areas of the first and second semiconductor chips 2, 3. The fourth line paths 86 connect the contact areas situated at the edges of the semiconductor chip arrangement 1 to fourth external contacts 87 which are supported on external contact areas 88 arranged in edge regions of the fourth multichip module 8. In this arrangement, these fourth external contacts 87 protrude upward clearly over the active top sides of the semiconductor chips 2, 3.

FIG. 8 shows an electronic device 9 in cross section. The electronic device 9 comprises a second circuit carrier 91 made of an iron/chromium/nickel alloy whose surface has the passive reverse sides of a first thin-ground semiconductor chip 92 and of a second thin-ground semiconductor chip 93 put on it using second adhesive layers 95. The thin-ground semiconductor chips 92, 93 have a height of 120 μm and the second adhesive layers 95 have a layer thickness of 20 μm. The active top side of the thin-ground semiconductor chips 92, 93 includes contact areas 94 and regions of a photoimide passivation layer (not shown) provided thereon (alternatively, the entire surface of the electronic device 9 can be passivated).

Arranged between and next to the thin-ground semiconductor chips 92, 93 there is a second photopatterned insulating layer 96 that ends flush with the second circuit carrier 91 on the left and right sides, respectively. The second photopatterned insulating layer 96 comprises cardo and in the present exemplary embodiment has a layer thickness of 140 μm. Formed between the edge faces of the thin-ground semiconductor chips 92, 93 and the respective edge regions of the second photopatte med insulating layer 96 which are arranged next to these there are trenches 97, which in the present exemplary embodiment each have a width of 50 μm and extend downward as far as the surface of the second circuit carrier 91.

In the exemplary embodiment shown in FIG. 8, the trenches 97 are filled completely using a filling material 98. The surfaces of the second photopatterned insulating layer 96 and of the filling material 98 of the trenches 97 are situated on one plane with the active top sides of the thin-ground semiconductor chips 92, 93. In this embodiment, the filling material 98 filling the trenches 97 may also have slight bulges toward the top.

In the exemplary embodiment shown in FIG. 8, the filling material 98 is formed from a photoimide.

In a modification of the embodiment of FIG. 8, the filling material 98 for the trenches 97 may also be the insulating adhesive of the second adhesive layers 95, which fills the trenches 97 when the thin-ground semiconductor chips 92, 93 are inserted.

The surfaces of the filling material 98 for the trenches 97 and the surfaces of the second photopatterned insulating layer 96 have fifth line paths 99 running on them which connect the contact areas 94 of the thin-ground semiconductor chips 92, 93 both to one another and to external contacts 101 which have been connected to external contact areas situated in edge regions of the top side of the second photopatterned insulating layer 96. In this embodiment, the fifth line paths 99 may also run over the active top sides of the thin-ground semiconductor chips 92, 93, especially since these are provided with the photoimide passivation layer.

When the electronic device 9 is fabricated, the second circuit carrier 91 is first provided. Next, the insulating layer 96 is put onto the second circuit carrier 91 and photopatterned such that free regions for holding the thin-ground semiconductor chips 92, 93 and also saw channels (not shown in FIG. 8) between the electronic device 9 and adjacent electronic devices (likewise not shown in FIG. 8) are produced.

The semiconductor chips 92, 93 are first of all thin-ground. This method is known to the person skilled in the art and requires no further explanation here. Next, the thin-ground semiconductor chips 92, 93 are inserted into the free regions of the second photopatterned insulating layer 96 and at the same time are connected to the second circuit carrier 91 by the second adhesive layers 95. In this case, these adhesive layers 95 may also be conductive.

Next, a further insulating layer (not shown explicitly in FIG. 8) is put onto the electronic device 9 and is photopatterned such that only the contacts 94 and the saw channel remain free and such that the trenches 97 are filled.

In a variant of the electronic device 9 which is not shown in FIG. 8, inserting the thin-ground semiconductor chips 92, 93 into the free regions of the second photopatterned insulating layer 96 involves providing exactly the quantity of insulating adhesive for the adhesive not just to form second adhesive layers 95 with a layer thickness of 20 µm, which mount the passive reverse side of the thin-ground semiconductor chips 92, 93 on the second circuit carrier 91, but for this adhesive also to fill the trenches 97 fully in capillary fashion.

In a subsequent method step, the fifth line paths 99 are put on, which can also ground the circuit carrier 91 via the saw channel. Finally, external contacts 101 are also put onto the external contact areas 100 in order to be able to connect the electronic device 9 to a higher printed circuit board, for example.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A multichip module comprising at least one first semiconductor chip and at least one second semiconductor chip, the semiconductor chips being arranged in a coplanar manner with respect to each other on or in a support medium and including contact areas arranged on active top sides of the first and second semiconductor chips;
   wherein at least one second semiconductor chip is arranged adjacent with at least one first semiconductor chip, and the at least one second semiconductor chip includes an arrangement of contact areas that is at least partly mirror image symmetrical in relation to an arrangement of contact areas of the at least one first semiconductor chip that is adjacent the second semiconductor chip such that contact areas disposed at or near a first edge of a first semiconductor chip are aligned and correspond with contact areas disposed at or near a first edge of an adjacent second semiconductor chip that faces the first edge of the first semiconductor chip, and contact areas disposed at or near a second edge of the first semiconductor chip that opposes the first edge of the first semiconductor chip are aligned and correspond with contact areas disposed at or near a second edge of the adjacent second semiconductor chip that opposes the first edge of the second semiconductor chip; and
   wherein first wiring arrangements extend between contact areas of adjacent first and second semiconductor chips, and second wiring arrangements extend from contact areas on at least some of the semiconductor chips to external contacts on the multichip module.

2. The multichip module of claim 1, wherein a respective first semiconductor chip is associated with a single second semiconductor chip such that an arrangement of contact areas of the single second semiconductor chip is mirror image symmetrical in relation to the contact areas of the respective first semiconductor chip.

3. The multichip module of claim 1, further comprising a plurality of first semiconductor chips and a plurality of second semiconductor chips, wherein the first semiconductor chips and the second semiconductor chips are arranged in a checkerboard-like pattern such that each first semiconductor chip is adjacent at least one second semiconductor chip and each second semiconductor chip is adjacent at least one first semiconductor chip.

4. The multichip module of claim 1, wherein the at least one second semiconductor chip includes an arrangement of components that is at least partly mirror image symmetrical in relation to an arrangement of components of the at least one first semiconductor chip such that components disposed at or near the first edge of the first semiconductor chip are aligned and conespond with a same type of components disposed at or near the first edge of the adjacent second semiconductor chip that faces the first edge of the first semiconductor chip, and components disposed at or near the second edge of the first semiconductor chip that opposes the first edge of the first semiconductor chip are aligned and correspond with a same type of components disposed at or near the second edge of the adjacent second semiconductor chip that opposes the first edge of the second semiconductor chip.

5. The multichip module of claim 1, further comprising wiring lines that connect contact areas disposed on a first semiconductor chip with contact areas disposed on an adjacent second semiconductor chip, wherein the wiring lines connect contact areas between the first and second semiconductor chips that are arranged at mirror image symmetrical locations with respect to each other and in relation to the first edges of the first and second semiconductor chips.

6. The multichip module of claim 1, wherein the support medium comprises a circuit substrate including a first side with contact pads that are connected, via through contacts, to external contacts arranged on a second side of the circuit substrate, passive reverse sides of the semiconductor chips are disposed on the first side of the circuit substrate, the first wiring arrangements include first bonding connections and portions of the second wiring arrangements include second bonding connections, the second bonding connections connect contact areas to the contact pads, and the semiconductor chips and the first and second bonding are encased in a plastic compound.

7. The multichip module of claim 1, wherein the support medium comprises a primary board including a first side that faces the active top sides of the semiconductor chips and holds metal wiring arrangements in at least one rewiring layer, the metal wiring arrangements being connected, via through contacts, to external contacts arranged on a second side of the primary board, the contact areas of the semiconductor chips are connected via flip chip contacts to the metal wiring arrangements, and a plastic compound encases the semiconductor chips and the first side of the primary board including the metal wiring arrangements and the flip chip contacts.

8. The multichip module of claim 1, wherein the support medium comprises a plastic compound that encloses the semiconductor chips such that the active top sides of the semiconductor chips remain uncovered, a patterned insulating layer comprising one of polyimide and benzocyclobutene extends over the active top sides of the semiconductor chips and over regions of a top side of the plastic compound that are arranged between and adjacent the semiconductor chips such that the contact areas of the semiconductor chips remain uncovered, the first rewiring arrangements are arranged at least partially on the patterned insulating layer such that each first rewiring arrangement connects together opposite contact areas from semiconductor chips that are situated adjacent each other, and the second rewiring arrangements are arranged at least partially on the patterned insulating layer to connect contact areas disposed at outer edges of the semiconductor chips to external contacts arranged on the insulating layer.

9. The multichip module of claim 1, wherein the support medium comprises a circuit carrier comprising metal, the circuit carrier including a top side onto which a passive reverse side of each of the semiconductor chips connects via an adhesive layer, the first wiring arrangements and the second wiring arrangements are situated in at least one patterned rewiring layer that includes external contact areas on which the external contacts are arranged, and the at least one patterned rewiring layer extends over the active top sides of the semiconductor chips and over the top side of the circuit carrier.

10. The multichip module of claim 9, wherein a patterned insulating layer extends below the first wiring arrangements and the second wiring arrangements and at least over regions of the top side of the circuit carrier that are not covered by the semiconductor chips.

11. The multichip module of claim 10, wherein the layer thickness of the insulating layer correspond with at least one of the height of the semiconductor chips and the combined height of the semiconductor chips and the adhesive layer.

12. The multichip module of claim 10, wherein the patterned insulating layer and regions of the active top sides of the semiconductor chips support a further patterned insulating layer on which the first wiring arrangements and the second wiring arrangements are routed.

13. The multichip module of claim 12, wherein the combined layer thickness of the patterned insulating layer and the further patterned insulating layer is at least the same dimension as the height of the semiconductor chips and the layer thickness of the adhesive layer.

14. The multichip module of claim 10, wherein transitional points comprising an elastomer material are adjacent to the semiconductor chips, the transitional points support the first wiring arrangements and the second wiring arrangements and are used to route the first wiring arrangements and the second wiring arrangements from the active top sides of the semiconductor chips to the top side of the circuit carrier or to the patterned insulating layer.

15. A printed circuit board comprising at least one first component arranged thereon and at least one second component arranged thereon, the components comprising one of ball grid arrays and flat conductor frame based packages and including contact pads;

wherein at least one second component is arranged adjacent with at least one first component, and the at least one second component includes an arrangement of contact areas that is at least partly mirror image symmetrical in relation to an arrangement of contact areas of the at least one first component that is adjacent the at least one second component such that contact areas contact areas disposed at or near a first edge of a first component are aligned and correspond with contact areas disposed at or near a first edge of an adjacent second component that faces the first edge of the first component, and contact areas disposed at or near a second edge of the first component that opposes the first edge of the first component are aligned and correspond with contact areas disposed at or near a second edge of the adjacent second component that opposes the first edge of the second component; and wherein first wiring arrangements extend between contact areas of adjacent first and second components, and second wiring arrangements extend from contact areas on at least some of the components to external contacts on the multichip module.

16. An electronic device comprising:

at least one thin-ground semiconductor chip including a height of less than 150 µm and contact areas and further including a passivation layer on an active top side of the semiconductor chip;

at least one circuit carrier comprising a metal or an alloy, wherein a passive reverse side of the at least one thin-ground semiconductor chip is secured onto a top side of the circuit carrier with an adhesive layer;

a photopatterned insulating layer formed of one of cardo, benzocyclobutene and polyimide, and extending next to the at least one thin-ground semiconductor chip and over the top side of the circuit carrier so as to leave exposed a saw channel at the edge of the electronic device, wherein the layer thickness of the photopatterned insulating layer corresponds with the sum of the height of the at least one thin-ground semiconductor chip and the layer thickness of the adhesive layer arranged below the at least one thin-ground semiconductor chip, and wherein trenches are arranged between lateral faces of the at least one thin-ground semiconductor chip and the photopatterned insulating layer and the trenches are filled with an insulating material;

line paths disposed on at least one rewiring layer and that are routed on at least one of the photopatterned insulating layer, the insulating material of the trenches, the passivation layer of the active top side of the at least one thin-ground semiconductor chip and the circuit carrier in the saw channel, wherein the line paths connect at least two of the contact areas of the at least one thin-ground semiconductor chip, external contact areas arranged on the photopatterned insulating layer and the circuit carrier; and external contacts arranged on the external contact areas.

17. The electronic device of claim 16, wherein the circuit carrier comprises an iron/chromium/nickel alloy.

18. The electronic device of claim 16, wherein the circuit carrier has a coefficient of thermal expansion between 11.3 16.6 ppm/°K and 16.6 ppm/°K.

19. The electronic device of claim 16, wherein the insulating material of the trenches comprises the same material that forms the insulating adhesive layer disposed below the at least one thin-ground semiconductor chip.

20. The electronic device of claim 16, wherein the insulating material of the trenches comprises one of benzocyclobutene, polyimide and cardo.

21. The electronic device of claim 16, wherein the circuit carrier is placed at a defined potential via line paths extending to the edge of the electronic device.

22. A method for fabricating electronic devices comprising:
- forming a rectangular circuit carrier from metal or an alloy and including a support top side;
- providing at least one semiconductor chip including contact areas and a passivation layer on an active top side of the at least one semiconductor chip, wherein the at least one semiconductor chip is thin-ground to a height of less than 150 µm;
- securing an insulating layer formed of one of cardo, benzocyclobutene and polyimide onto a surface of the circuit carrier such that a layer thickness of the insulating layer corresponds to the total sum of the heights of the at least one thin-ground semiconductor chip and a layer thickness of an adhesive layer that is to be arranged below the at least one semiconductor chip;
- photopatterning the insulating layer such that at least one free region is produced on the circuit carrier for receiving the at least one thin-ground semiconductor chip;
- securing the at least one thin-ground semiconductor chip, with a passive reverse side of the at least one thin-ground semiconductor chip, into the at least one free region on the circuit carrier using an adhesive layer;
- filling trenches defined between lateral faces of the at least one thin-ground semiconductor chip and the photopatterned insulating layer with an insulating material;
- forming line paths with at least one rewiring layer on at least one of the photopatterned insulating layer, the insulating material of the trenches, the passivation layer on the active top side of the at least one thin-ground semiconductor chip and external contact areas disposed on the photopatterned insulating layer, wherein the line paths make at least partial contact with the contact areas of the at least one thin-ground semiconductor chip;
- putting external contacts onto the external contact areas; and
- splitting the circuit carrier at outer edges of the circuit carrier into individual electronic devices.

23. The method of claim 22, wherein the trenches between the lateral faces of the at least one thin-ground semiconductor chip and the photopatterned insulating layer are filled by putting on and photopatterning a further insulating layer formed of one of benzocyclobutene, polyimide and cardo.

24. The method of claim 22, wherein the trenches between the lateral faces of the at least one thin-ground semiconductor chip and the photopatterned insulating layer are filled by adhesive when the at least one thin-ground semiconductor chip is put onto the circuit carrier, wherein the quantity of adhesive for each thin-ground semiconductor chip is proportioned such that the sum of the volume of the quantity of adhesive and the volume of the respective thin-ground semiconductor chip correspond at least to the volume of a respective free region of the photopatterned insulating layer.

* * * * *